(12) United States Patent
Kamimura

(10) Patent No.: US 9,688,912 B2
(45) Date of Patent: Jun. 27, 2017

(54) ETCHING METHOD, AND ETCHING LIQUID TO BE USED THEREIN AND METHOD OF PRODUCING A SEMICONDUCTOR SUBSTRATE PRODUCT USING THE SAME

(75) Inventor: Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 215 days.

(21) Appl. No.: 13/560,366

(22) Filed: Jul. 27, 2012

(65) Prior Publication Data

US 2014/0030896 A1 Jan. 30, 2014

(51) Int. Cl.
| | |
|---|---|
| C09K 13/06 | (2006.01) |
| C09K 13/00 | (2006.01) |
| H01L 21/02 | (2006.01) |
| H01L 21/311 | (2006.01) |
| H01L 21/3213 | (2006.01) |

(52) U.S. Cl.
CPC .............. *C09K 13/00* (2013.01); *C09K 13/06* (2013.01); *H01L 21/02063* (2013.01); *H01L 21/31144* (2013.01); *H01L 21/32134* (2013.01)

(58) Field of Classification Search
USPC .......................... 106/14.42; 132/208; 134/26; 210/500.38; 216/83, 88; 252/79.1, 79.5; 424/616; 428/199; 438/690, 692, 693, 438/745, 754; 502/64; 51/308; 510/175, 510/176
See application file for complete search history.

(56) References Cited

U.S. PATENT DOCUMENTS

| | | | |
|---|---|---|---|
| 6,585,910 B1 | 7/2003 | Kikuyama et al. | |
| 2002/0106458 A1* | 8/2002 | Montano et al. | ............. 427/410 |
| 2005/0011400 A1* | 1/2005 | Owei | ...................... C23C 22/52 |
| | | | 106/14.44 |
| 2008/0035882 A1* | 2/2008 | Zhao et al. | ................... 252/79.4 |
| 2010/0163788 A1* | 7/2010 | Visintin et al. | .............. 252/79.3 |

FOREIGN PATENT DOCUMENTS

| | | |
|---|---|---|
| JP | 10-177998 A | 6/1998 |
| JP | 11-121442 A | 4/1999 |
| JP | 2000-347221 A | 12/2000 |
| JP | 2006-199987 A | 8/2006 |
| JP | 2008-536312 A | 9/2008 |

(Continued)

OTHER PUBLICATIONS

Machine translation of JP 2010-010273 pulled Apr. 5, 2014.*

(Continued)

*Primary Examiner* — Duy Deo
*Assistant Examiner* — Erin Bergner
(74) *Attorney, Agent, or Firm* — Sughrue Mion, PLLC

(57) ABSTRACT

A method of etching a semiconductor substrate, having the steps of: providing a semiconductor substrate having a first layer containing Ti and a second layer containing at least one of Cu, SiO, SiN, SiOC and SiON; providing an etching liquid containing, in an aqueous medium, a basic compound composed of an organic amine compound and an oxidizing agent, the etching liquid having a pH from 7 to 14; and applying the etching liquid to the semiconductor substrate to selectively etch the first layer of the semiconductor substrate.

12 Claims, 2 Drawing Sheets

(56) References Cited

FOREIGN PATENT DOCUMENTS

| JP | 2008-285508 A | 11/2008 |
|---|---|---|
| JP | 2009-141074 A | 6/2009 |
| JP | 2010-10273 A | 1/2010 |
| WO | 2009/081884 A1 | 7/2009 |

OTHER PUBLICATIONS

Communication dated May 7, 2013 from the Japanese Patent Office in corresponding Japanese application No. 2012-134918.
Communication dated Sep. 24, 2013 from the Japanese Patent Office in corresponding Japanese application No. 2012-134918.

\* cited by examiner

ETCHING METHOD, AND ETCHING LIQUID TO BE USED THEREIN AND METHOD OF PRODUCING A SEMICONDUCTOR SUBSTRATE PRODUCT USING THE SAME

TECHNICAL FIELD

The present invention relates to a method of selectively etching a specific metal material, and etching liquid to be used therein and a method of producing a semiconductor substrate product using the same.

BACKGROUND ART

Miniaturization and diversification of semiconductor devices become more advancing than ever. In this connection, producing methods of the semiconductor devices are diversified with respect to each device structure and production step. Taking etching of a substrate as an example, a variety of chemical species, processing conditions, and the like are proposed in accordance with both kind and structure of a substrate material in both dry etching and wet etching. Further, intensive research and development are proceeding with the etching.

Among them, a technique of precisely etching to form a device structure of CMOS, DRAM, and the like is important. One of the techniques is a wet etching using a chemical liquid. For example, in the production of a circuit wiring in a microscopic transistor circuit and a substrate having a metal electrode material, a precise etching processing is required. Further, the same is true on the production of an electrode structure in the capacitor structure of the above-mentioned DRAM. However, adequate studies have not yet done on the conditions and chemical liquids for selectively etching each layer applied to a substrate having a metal electrode or the like.

There are examples of the studies made on chemical liquids for etching silicon oxides that constitute a device substrate. For example, Patent Literature 1 proposes a method of efficiently etching a thermally-oxidized film of a silicon wafer by using hydrofluoric acid and ammonium fluoride.

CITATION LIST

Patent Literature

Patent Literature 1: JP-A-10-177998 ("JP-A" means unexamined published Japanese patent application)

DISCLOSURE OF INVENTION

The present invention provides the following means:

A method of etching a semiconductor substrate, comprising the steps of:
providing a semiconductor substrate having a first layer and a second layer, the first layer containing Ti, the second layer containing at least one of Cu, SiO, SiN, SiOC and SiON;
providing an etching liquid containing, in an aqueous medium, a basic compound composed of an organic amine compound and an oxidizing agent, the etching liquid having a pH of 7 or more; and
applying the etching liquid to the semiconductor substrate to selectively etch the first layer of the semiconductor substrate.

An etching liquid, selectively etching a first layer containing Ti with regard to a second layer containing at least one of Cu, SiO, SiOC and SiON, the etching liquid comprising, in an aqueous medium, a basic compound composed of an organic amine compound and an oxidizing agent, the etching liquid having a pH from 7 to 14.

A method of producing a semiconductor substrate product, comprising the steps of:
providing a semiconductor substrate having a first layer and a second layer, the first layer containing Ti, the second layer containing at least one of Cu, SiO, SiN, SiOC and SiON;
providing a specific etching liquid containing, in an aqueous medium, an oxidizing agent and a basic compound composed of an organic amine compound, the etching liquid having a pH from 7 to 14; and
applying the etching liquid to the semiconductor substrate to selectively etch the first layer of the semiconductor substrate.

REFERENCE SIGNS LIST

Figure 1:
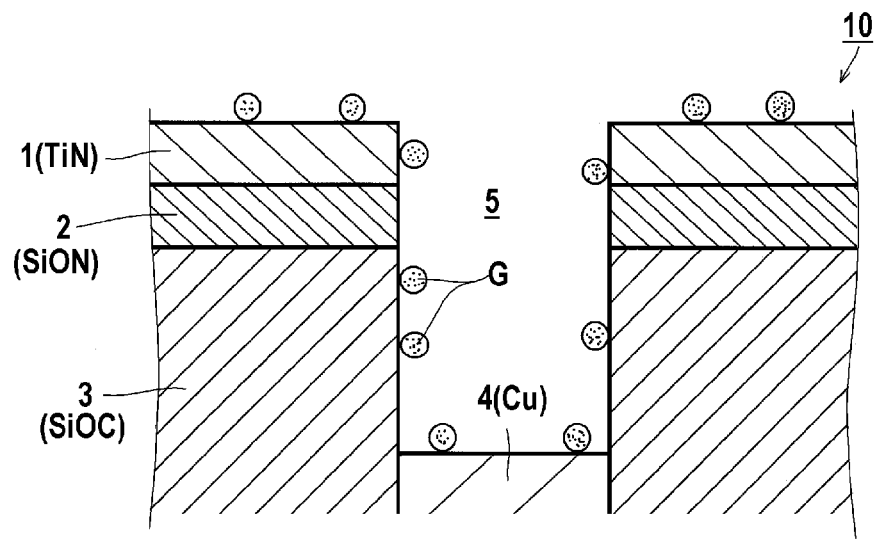
FIG. 1 is a cross-sectional view diagrammatically showing an example of production step (before etching) of the semiconductor substrate according to an embodiment of the present invention.

1: TiN layer
2: SiON layer
3: SiOC layer
4: Cu layer
5: Via
14: W layer
G: Residue Other and further features and advantages of the invention will appear more fully from the following description, appropriately referring to the accompanying drawing.

MODE FOR CARRYING OUT THE INVENTION

The present inventors have made investigation into a chemical liquid that enables selective etching of a Ti-containing layer and an etching method using the same. In addition, the present inventors have addressed development of an etching method and a chemical liquid used to be therein capable of drastically improving production efficiency so that a residue, that is produced by plasma etching, ashing, and the like carried out in the production of the semiconductor, can be washed and removed at the same time during the wet etching step.

That is, the present invention is contemplated for providing: an etching method that enables selective wet etching such that a Ti-containing layer is preferentially dissolved, and that can effectively wash and remove a residue, that is produced by etching, ashing, and the like; an etching liquid used in the etching method; and a method of producing a semiconductor substrate product using the etching liquid.

According to the present invention, there is provided the following means:

(1) A method of etching a semiconductor substrate, comprising the steps of:

providing a semiconductor substrate having a first layer and a second layer, the first layer containing Ti, the second layer containing at least one of Cu, SiO, SiN, SiOC and SiON;

providing an etching liquid containing, in an aqueous medium, a basic compound composed of an organic amine compound and an oxidizing agent, the etching liquid having a pH of 7 or more; and applying the etching liquid to the semiconductor substrate to selectively etch the first layer of the semiconductor substrate.

(2) The etching method as described in the item (1), wherein the basic compound is a compound represented by formula (I),

$$N(R)_4 \cdot OH \qquad \text{formula (I)}$$

wherein R represents a substituent; and plural Rs may be the same or different from each other.

(3) The etching method as described in the item (1), wherein the basic compound is tetramethylammonium hydroxide, tetraethylammonium hydroxide, or tetrapropylammonium hydroxide.

(4) The etching method as described in the item (1), wherein the oxidizing agent is any one or any combination of hydrogen peroxide, ammonium persulfate, perboric acid, peracetic acid, periodic acid, and perchloric acid.

(5) The etching method as described in the item (1), wherein a rate ratio (R1/R2) of an etching rate (R1) of the first layer to an etching rate (R2) of the second layer is set at 30 or more.

(6) The etching liquid as described in the item (1), having a water-soluble organic solvent.

(7) The etching method as described in the item (1), wherein the etching liquid is applied to selectively etch the first layer in the state that copper of the second layer is exposed, and wherein the semiconductor substrate has a third layer containing W, and the first layer is selectively etched by applying an etching liquid containing nitric acid in the state that W is exposed.

(8) The etching method as described in the item (1), wherein the etching is conducted at within a temperature range from 20 to 80° C.

(9) An etching liquid, selectively etching a first layer containing Ti with regard to a second layer containing at least one of Cu, SiO, SiOC and SiON, the etching liquid comprising, in an aqueous medium, a basic compound composed of an organic amine compound and an oxidizing agent, the etching liquid having a pH from 7 to 14.

(10) The etching liquid as described in the item (9), wherein a rate ratio (R1/R2) of an etching rate (R1) of the first layer to an etching rate (R2) of the second layer is 30 or more.

(11) The etching liquid as described in the item (9), wherein the concentration of the basic compound is from 0.05 mass % to 50 mass %.

(12) The etching liquid as described in the item (9), wherein the concentration of the oxidizing agent is from 0.5 mass % to 20 mass %.

(13) The etching liquid as described in the item (9), having a water-soluble organic solvent.

(14) The etching liquid as described in the item (13), wherein the water-soluble organic solvent is a glycol compound.

(15) A kit, comprising:

the specific etching liquid as described in the item (9); the specific etching liquid for being applied to selectively etch the first layer in the state that copper of the second layer is exposed; and an etching liquid containing nitric acid, the etching liquid for being applied to selectively etch the first layer in the state that a third layer containing W is exposed, W being contained in a semiconductor substrate.

(16) A method of producing a semiconductor substrate product, comprising the steps of:

providing a semiconductor substrate having a first layer and a second layer, the first layer containing Ti, the second layer containing at least one of Cu, SiO, SiN, SiOC and SiON;

providing a specific etching liquid containing, in an aqueous medium, an oxidizing agent and a basic compound composed of an organic amine compound, the etching liquid having a pH from 7 to 14; and applying the etching liquid to the semiconductor substrate to selectively etch the first layer of the semiconductor substrate.

(17) The method of producing a semiconductor substrate product as described in the item (16), comprising the steps of:

providing a semiconductor substrate having the first layer, the second layer, and a third layer containing W;

applying the etching liquid containing nitric acid to selectively etch the first layer, in the state that the third layer is exposed; and applying the specific etching liquid to selectively etch the first layer, in the state that copper of the second layer is exposed.

In this specification, the term "providing" generally indicates getting a prescribed substance and is not limited to any particular meanings. For example, the term "providing" indicates producing a prescribed compound or substrate, obtaining the same by purchase or the like, and the like.

In the etching method of the present invention, a specific etching liquid is used and the etching liquid is applied to a semiconductor substrate having a first layer containing Ti and a specific second layer containing a silicon compound and copper whereby the first layer can be preferentially dissolved. At this time, a residue on the substrate also can be washed and removed at the same time with the selective etching. That is, selective etching in the semiconductor substrate and washing of a surface of the substrate can be achieved at the same time. This greatly contributes to improvement in production efficiency in addition to increase in product quality of the device. The reason for exhibiting such excellent effects is not fully understood, but estimated as follows.

The oxidizing agent such as hydrogen peroxide and the like, that is used as an essential component in the present invention, exhibits a high solubility with respect to a specific first layer containing Ti. Further, a high reactivity due to the oxidizing agent acts to the residue and the like whereby the oxidizing agent exhibits a high washing performance. On the other hand, it is estimated that a basic compound composed of a specific organic amine compound, that is also employed as an essential component, protects a surface of the second layer containing at least one of Cu, SiO, SiN, SiOC and SiON, thereby suppressing and preventing from etching by the oxidizing agent. Further, it is estimated that the oxidizing agent and the basic compound become functional when controlled to the prescribed pH environment, and both a selective etching effect and a residue-washing effect are exhibited at a high level due to an interaction between the oxidizing agent and the basic compound. The present invention is described in detail below on the basis of a preferable embodiment thereof. In the present specification, when elements that constitute a metal compound are described next to each other, such as SiOC, the SiOC means SiOxCy (x and y each represent an arbitrary composition). However, the metal compound sometimes may be expressed by describing the composition of the elements like SiOx.

[Etching Step]

Figure 2:
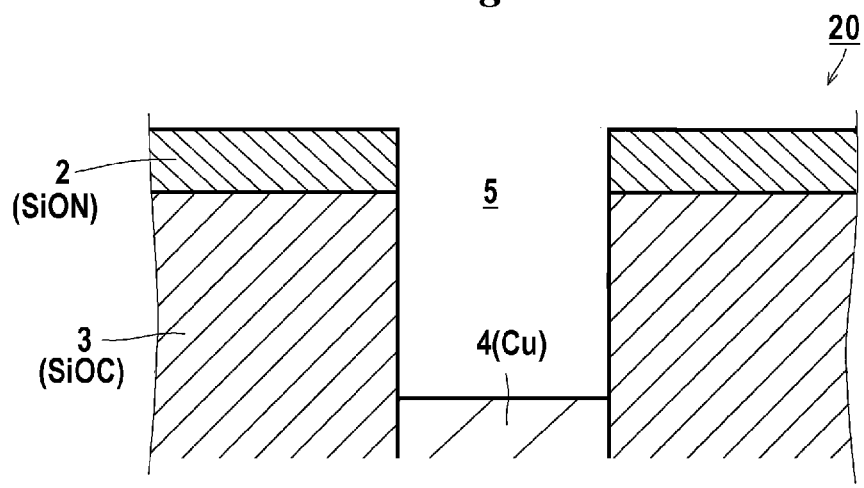
FIG. 2 is a cross-sectional view diagrammatically showing an example of production step (after etching) of the semiconductor substrate according to an embodiment of the present invention.

First, a preferable embodiment of the etching step according to the present invention are described on the basis of FIG. 1 and FIG. 2.

FIG. 1 is a view showing a semiconductor substrate before being etched. In an example of production of the present embodiment, a product is used, in which SiOC layer 3 and SiON layer 2 as a specific second layer are disposed on a silicon wafer (not shown) and TiN layer 1 is formed on the SiON layer 2 at the upper side thereof. At this time, via 5 has already been formed in this composite layer, and Cu layer 4 has been formed at the bottom of the via 5. The etching liquid (not shown) in the present embodiment is applied onto the substrate 10 of the above-described configuration, thereby to remove the TiN layer. The etching liquid also has performance to achieve removal and washing of residues G that is produced by plasma etching, ashing, and the like. Accordingly, the residues G can be also removed effectively. As a result, as shown in FIG. 2, substrate 20, in which both the TiN film and the residues G have been removed, can be obtained. Needless to say, the etched and washed state as graphically-illustrated is ideal for the present invention. However, the rest of the TiN layer and residues, and some corrosion of the second layer is appropriately acceptable in accordance with the required quantity and the like of the semiconductor device to be produced. Accordingly, the present invention is not restrictively interpreted by the above description.

The term "silicon substrate" and "semiconductor substrate" are used in a broad meaning including not only a silicon wafer, but also the whole structure of the substrate provided with a circuit structure. The member of the substrate refers to a member that constitutes the above-defined silicon substrate. The member may be composed of one material, or a plurality of materials. Sometimes, the silicon substrate that has been processed may be distinctly called as a silicon substrate product. A chip taken out by further processing the silicon substrate according to the necessity and dicing the same, and a processed product of the chip are called as a semiconductor device. The direction of the substrate is expressed as follows, unless it is explicitly stated otherwise. In FIG. 1, the side opposite to a silicon wafer (TiN side) is called "upper" or "top", while the silicon wafer side (SiOC side) is called "below" or "bottom".

[Silicon Etching Liquid]

Hereinafter, a preferable embodiment of a silicon etching liquid is described. The silicon etching liquid of the embodiment contain a specific oxidizing agent and a specific basic compound. Hereinafter, each components as well as optional components are described. In the present specification, the term "liquid containing a specific component" not only means a liquid composition containing the specific component, but also includes the meaning of a kit that is used by mixing each component, and a liquid, a powder and the like containing said each component before use.

(Oxidizing Agent)

Examples of the oxidizing agent include hydrogen peroxide, ammonium persulfate, perboric acid, peracetic acid, periodic acid, perchloric acid, and any combination thereof. Among them, hydrogen peroxide is particularly preferable.

The oxidizing agent is preferably contained within a range from 0.5 to 20% by mass, more preferably from 1 to 15% by mass, and still more preferably from 2 to 10% by mass, with respect to the total mass of the etching liquid of the present embodiment. Further, as another embodiment, the oxidizing agent is preferably contained within a range 0.5% by mass or more, more preferably 1% by mass or more, and still more preferably 2% by mass or more, with respect to the total mass of the etching liquid. The oxidizing agent is preferably contained in the upper limit of 20% by mass or less, more preferably 15% by mass or less, still more preferably 10% by mass or less, still more preferably 8% by mass or less, and particularly preferably 6% by mass or less. It is preferable to control the content of the oxidizing agent to the above-described upper limit or less because such content is expected to be effective in more suppressing both excess etching of the second layer and time degradation (deactivation). It is preferable to control the content of the oxidant to the above-described lower limit or more from the viewpoint of etching the first layer in a sufficient rate.

(Basic Compound)

The basic compound is not particularly limited, as long as it is constituted of an organic amine compound. The basic compound is preferably a compound having any of a primary amine to a quaternary amine (ammonium) in the structure thereof. Examples of the organic amine compound include a primary alkyl amine having 1 to 6 carbon atom(s), a primary aromatic amine having 6 to 12 carbon atoms, a secondary amine having 2 to 6 carbon atoms, a tertiary amine having 3 to 6 carbon atoms, a quaternary ammonium having 4 to 16 carbon atoms or salts thereof, 2-aminoethanol and guanidine carbonate.

Among them, a basic compound represented by the following formula (I) is preferable.

N(R)$_4$.OH                    formula (I)

R represents a substituent. Plural Rs may be different from each other. R preferably represents an alkyl group, an alkenyl group, an alkynyl group, an aryl group, and an aralkyl group. The preferable range thereof has the same meaning as that of the following substituent T. Among them, tetramethylammonium hydroxide (TMAH), tetraethylammonium hydroxide (TEAH), tetrapropylammonium hydroxide (TPAH), and tetrabuthylammonium hydroxide (TBAH) are particularly preferable. Further, these compound may be combined with each other without any problem.

The basic compound is preferably contained within a range from 0.05 to 50% by mass, more preferably from 0.05 to 20% by mass, still more preferably from 0.5 to 15% by mass, particularly preferably from 0.5 to 10% by mass, with respect to the total mass of the etching liquid of the present embodiment. Further, as another embodiment, the basic compound is preferably contained within a range of 0.05% by mass or more, and more preferably 0.5% by mass or more, with respect to the total mass of the etching liquid. The basic compound is preferably contained in the upper limit of 50% by mass or less, more preferably 20% by mass or less, still more preferably 15% by mass or less, and particularly preferably 10% by mass or less. It is preferable to control the content of the basic compound to the above-described upper limit or less from the viewpoint of avoiding the problem in which the basic compound itself prohibits etching of the metal layer. It is preferable to control the content of the basic compound to the above-described lower limit or more from the viewpoint of sufficiently suppressing etching of the second layer.

In term of the relation with the oxidizing agent, the basic compound is preferably used in an amount from 0.5 to 50 parts by mass, and more preferably from 10 to 40 parts by mass, with respect to 100 parts by mass of the oxidizing agent. Further, as another embodiment, the basic compound is preferably contained in a range of 0.5 part(s) by mass or more, and more preferably 10 parts by mass or more, with respect to 100 parts by mass of the oxidizing agent. The basic compound is preferably contained in the upper limit of 50 parts by mass or less and more preferably 40 parts by mass or less. By using amounts of both components in an appropriate relation, good performances of etching and removal of the residue can be realized, and also high etching selectivity can be achieved.

In the present specification, when the name of a chemical is called by putting the term "compound" at the foot of the chemical name, or when the chemical is shown by a specific name or a chemical formula, a showing of the compound is used to mean not only the compound itself, but also a salt or ion thereof and the like. Further, the showing of the compound is also used to mean incorporation of derivatives modified by a predefined configuration to an extent necessary to obtain a desired effect. Further, in the present specification, when a specific atomic group is called by putting the term "group" at the foot of the specific atomic group with respect to the substituent, the group means that the group may have further an arbitrary substituent. This is also applied to a compound in which substitution or non-substitution is not explicitly stated. Examples of preferable substituents include the following substituent T.

(Substituent T)

The substituents T include an alkyl group (preferably an alkyl group having 1 to 20 carbon atom(s), for example, methyl, ethyl, isopropyl, t-butyl, pentyl, heptyl, 1-ethylpentyl, benzyl, 2-ethoxyethyl, and 1-carboxymethyl), an alkenyl group (preferably an alkenyl group having 2 to 20 carbon atoms, for example, vinyl, allyl, and oleyl), an alkynyl group (preferably an alkynyl group having 2 to 20 carbon atoms, for example, ethynyl, butadiynyl, and phenylethynyl), a cycloalkyl group (preferably a cycloalkyl group having 3 to 20 carbon atoms, for example, cyclopropyl, cyclopentyl, cyclohexyl, and 4-methylcyclohexyl), an aryl group (preferably an aryl group having from 6 to 26 carbon atoms, for example, phenyl, 1-naphthyl, 4-methoxyphenyl, 2-chlorophenyl, and 3-methylphenyl), a heterocyclic group (preferably a heterocyclic group having 2 to 20 carbon atoms, for example, 2-pyridyl, 4-pyridyl, 2-imidazolyl, 2-benzimidazolyl, 2-thiazolyl, and 2-oxazolyl), an alkoxy group (preferably an alkoxy group having 1 to 20 carbon atom(s), for example, methoxy, ethoxy, isopropyloxy, and benzyloxy), an aryloxy group (preferably an aryloxy group having from 6 to 26 carbon atoms, for example, phenoxy, 1-naphthyloxy, 3-methylphenoxy, and 4-methoxyphenoxy), an alkoxycarbonyl group (preferably an alkoxycarbonyl group having 2 to 20 carbon atoms, for example, ethoxycarbonyl and 2-ethylhexyloxycarbonyl), an amino group (preferably an amino group having 0 to 20 carbon atom(s), for example, amino, N,N-dimethylamino, N,N-diethylamino, N-ethylamino, and anilino), a sulfonamide group (preferably a sulfonamide having 0 to 20 carbon atom(s), for example, N,N-dimethylsulfonamide, and N-phenylsulfonamide), an acyl group (preferably an acyl group having 1 to 20 carbon atom(s), for example, acethyl, propionyl, buthylyl and benzoyl), an acyloxy group (preferably an acyloxy group having 1 to 20 carbon atom(s), for example, acethyloxy and benzoyloxy), a carbamoyl group (preferably a carbamoyl group having 1 to 20 carbon atom(s), for example, N,N-dimethylcarbamoyl and N-phenylcarbamoyl), an acyl amino group (preferably an acylamino group having 1 to 20 carbon atom(s) for example, acetylamino and benzoylamino), a cyano group, and a halogen atom (for example, a fluorine atom, a chlorine atom, a bromine atom, and an iodine atom). Among them, an alkyl group, an alkenyl group, an aryl group, a heterocyclic group, an alkoxy group an aryloxy group, an alkoxycarbonyl group, an amino group, an acylamino group, a cyano group, and a halogen atom are more preferable. An alkyl group, an alkenyl group, a heterocyclic group, an alkoxy group, an alkoxycarbonyl group, an amino group, an acylamino group, and a cyano group are particularly preferable.

[Aqueous Medium]

The etching liquid of the present invention is a water-based liquid composition in which an aqueous medium is contained as a medium. The term "aqueous medium" is referred to water and an aqueous solution in which a water-soluble solute has been dissolved in water. The solute means a material except for the above-described components to be essentially contained. If needed, arbitrary components may be separately specified. Examples of the solute herein described include alcohols and salts of inorganic compounds such as sodium chloride or the like. Even in the case where the solute is used, however, it is preferable that the amount of the solute be controlled to the range in which a desirable effect of the present invention becomes conspicuous. Further, the term "water-based composition" refers to a composition in which an aqueous medium is a main medium. More than a half of the medium other than solid contents is preferably an aqueous medium, more preferably 70% by mass or more thereof, and particularly preferably 90% by mass or more thereof.

[pH]

In the present invention, pH of the etching liquid is controlled at 7 or more, preferably 9 or more, further preferably 9.5 or more, furthermore preferably 10 or more. There is no particular upper limit of the pH of the etching liquid. The pH may be over 14 (for example, calculated pH of 16 or less). The pH is preferably adjusted to 14 or less, more preferably 13 or less. By adjusting the pH to the above-described lower limit or more, high speed-etching of the Ti-containing compound can be achieved in an adequate rate. It is preferable to adjust the pH to the above-described upper limit or less because such adjustment prevents etching of Cu, SiO, SiN, SiOC and SiON from excessive progression. In the present invention, the pH is defined as being a value obtained by using the instrument under the conditions used for measurement thereof in Examples, unless it is explicitly stated otherwise.

(Other Component)

pH Controlling Agent

In the present embodiment, the pH of the etching liquid is adjusted to the above-described range. For the adjustment, a pH controlling agent is preferably used. Examples of the pH controlling agent include the basic compound described in the above item [basic compound] for increasing pH, inorganic acids such as hydrochloric acid, nitric acid, sulfuric acid, and phosphoric acid, and organic acids such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, and lactic acid for decreasing pH.

The use amount of the pH controlling agent is not particularly limited, and the pH controlling agent may be used in an amount necessary to adjust the pH to the above-described range.

In the present invention, the silicon etching liquid may contain a water-soluble organic solvent. The term "water-soluble organic solvent" refers to an organic solvent capable of being mixed with water in an arbitrary proportion. Incorporation of the water-soluble organic solvent is effective in the point that a uniform etching performance in a plane of the wafer is further improved by the water-soluble organic solvent Examples of the water-soluble organic solvent include alcohol-compound solvents such as methyl alcohol, ethyl alcohol, 1-propyl alcohol, 2-propyl alcohol, 2-butanol, ethylene glycol, propylene glycol, glycerol, 1,6-hexanediol, cyclohexanediol, sorbitol, xylitol, 2-methyl-2,4-pentanediol, 1,3-butanediol, and 1,4-butanediol, and ether-compound solvents such as alkylene glycol alkyl ether (e.g. ethylene glycol monomethyl ether, ethylene glycol monobutyl ether, diethylene glycol, dipropylene glycol, propylene glycol monomethyl ether, diethylene glycol monomethyl ether, triethylene glycol, polyethylene glycol, propylene glycol monomethyl ether, dipropylene glycol monomethyl ether, tripropylene glycol monobuthyl ether, diethylene glycol monobuthyl ether, and diethylene glycol monobuthyl ether).

Among them, an alcohol compound solvent having 2 to 15 carbon atoms and an alcohol/ether compound solvent having 2 to 15 carbon atoms are preferable. An alcohol compound solvent having 2 to 10 carbon atoms and two or more hydroxyl groups and an alcohol/ether compound solvent having 2 to 10 carbon atoms and two or more hydroxyl groups are more preferable. An alkylene glycol alkyl ether having 3 to 8 carbon atoms is particularly preferable. The water-soluble organic solvent may be used singly or by combining two or more kinds thereof. In the present specification, a compound having both a hydroxyl group (—OH) and an ether group (—O—) in the molecule thereof is basically in the category of ether compounds (this is not referred to as an alcohol compound). In the case where a compound having both a hydroxyl group and an ether group in the molecule thereof is described in particular, this compound may be referred to as an alcohol/ether compound.

Among these, propylene glycol and dipropylene glycol are especially preferable. The addition amount thereof is preferable within an amount from 0.1 to 70% by mass, and more preferable within an amount from 10 to 50% by mass, with respect to the total amount of the etching liquid. By controlling the addition amount to the above-described lower limit or more, uniformity improvement of the etching can be realized in an effective manner.

In the present invention, the addition of the above-described water-soluble organic solvent is very effective. Due to the addition, an excellent selective-etching effect becomes remarkable whereby high etching effect can be obtained in various embodiments of the constitution.

It is preferable that the etching liquid of the present invention contains no complex compound such as ethylenediamine tetraacetic acid (EDTA) or the like on account of corrosion resistance properties of SiO and SiOC. From this point of view, it is preferable that the etching liquid of the present invention is substantially constituted of the basic compound, the oxidizing agent and the aqueous medium as described above, or substantially constituted of the basic compound, the oxidizing agent, the water-soluble organic solvent and the aqueous medium as described above. Herein, the term "substantially" means that some components such as inevitable impurities or the like are allowed to be contained in a range in which a desirable effect can be achieved.

[Etching Condition]

The etching conditions in the present embodiment are not particularly limited, but the etching method may be a spray-type (single wafer) etching or a batch-type (immersion) etching. In the spray-type etching, a semiconductor substrate is transported or rotated in the predetermined direction, and an etching liquid is sprayed in a space between them to put the etching liquid on the semiconductor substrate. On the other hand, in the batch-type etching, a semiconductor substrate is immersed in a liquid bath constituted of an etching liquid to contact the etching liquid with the semiconductor substrate. It is preferable for these etching methods to be used appropriately and selectively depending on a structure, a material, and the like of the device.

In the case of the spray-type, the environmental temperature of a spraying interspace for etching is preferably set within a range from 15 to 100° C., and more preferably from 20 to 80° C. On the other hand, the temperature of the etching liquid is preferably set within a range from 20 to 80° C., and more preferably from 30 to 70° C. It is preferable to set the temperature at the above-described lower limit or more because an adequate etching rate with respect to a metal layer can be ensured. It is preferable to set the temperature at the above-described upper limit or less because selectivity of etching can be ensured. The supply rate of the etching liquid is not particularly limited, but is preferably set within a range from 0.05 to 1 L/min, and more preferably from 0.1 to 0.5 L/min. It is preferable to set the supply rate at the above-described lower limit or more because uniformity in an etching plane can be ensured by the supply rate. It is preferable to set the supply rate at the above-described upper limit or less because stable selectivity at the time of continuous processing can be ensured by the supply rate. When the semiconductor substrate is rotated, it is preferable, from the same view point as the above, to rotate the semiconductor substrate at a rate from 50 to 400 rpm, even though the rate may depend on the size or the like of the semiconductor substrate.

In the case of the batch-type, the temperature of the liquid bath is preferably set within a range from 20 to 80° C., and more preferably from 30 to 70° C. It is preferable to set the temperature at the above-described lower limit or more because an adequate etching rate can be ensured. It is preferable to set the temperature at the above-described upper limit or less because selectivity of etching can be ensured. The immersion time of the semiconductor substrate is not particularly limited, but the immersion time is preferably set within a range from 0.5 to 30 minute(s), and more preferably from 1 to 10 minute(s). It is preferable to set the immersion time at the above-described lower limit or more because uniformity in an etching plane can be ensured. It is preferable to set the immersion time to the above-described upper limit or less because stable selectivity at the time of continuous processing can be ensured.

[Residue]

The production process of the semiconductor device includes a step of etching a metal layer and the like on the semiconductor substrate by plasma etching using a resist pattern or the like as a mask. Specifically, there are steps of etching a metal layer, a semiconductor layer, an insulating layer, and the like to pattern the metal layer and the semiconductor layer; and of form an opening section such as a via hole or a wiring gutter in the insulating layer. In the plasma etching, a residue originated from the resist used as a mask, or originated from the metal layer, the semiconductor layer or the insulating layer each of which is to be etched is produced on the semiconductor substrate. In the present invention, the residue thus produced by the plasma etching is referred to as a "plasma etching residue".

Further, the resist pattern having been used as a mask is removed after etching. For removal of the resist pattern, a wet-type method of using a stripper solution and a dry-type method, in which ashing is performed using, for example, plasma, ozone, or the like, are used, as described above. In the ashing, a residue modified from the plasma etching residue having been produced by plasma etching and a residue originated from a resist to be removed are produced on the semiconductor substrate. In the present invention, the residue thus produced by the ashing is referred to as an "ashing residue". Further, sometimes the term "residue" may be simply used as the generic name for the residue that has been produced on a semiconductor substrate and that should be washed and removed, such as the plasma etching residue and the ashing residue.

Both the plasma etching residue and the ashing residue that are the residue after such etching (Post Etch Residue) are preferably washed and removed using a cleaning composition. The etching liquid of the present embodiment may be also used as a cleaning liquid for removal of the plasma etching residue and/or the ashing residue. Especially, after a plasma ashing conducted subsequent to the plasma etching, the etching liquid of the present embodiment is preferably used for removal of the plasma etching residue and the ashing residue.

[Material to be Processed]

A material that is etched by applying the etching liquid of the present embodiment is not particularly limited, but it is required for the etching liquid of the present embodiment to be applied to a semiconductor substrate having a first layer containing Ti and a second layer containing at least one of Cu, SiO, SiN, SiOC and SiON. Herein, the term "SiO" means to include a thermally-oxidized film of silicon and SiO and therefore it includes $SiO_x$.

First Layer

The first layer is preferably etched at a high etching rate. Especially, a first layer containing TiN is particularly preferable. Although the thickness of the first layer is not particularly limited, in view of the composition of an ordinary device, it is practical that the thickness is from approximately 0.005 to 0.3 μm. Although the etching rate [R1] of the first layer is not particularly limited, in view of production efficiency, the etching rate from 50 to 500 Å/min is preferable.

Second Layer

It is preferable that the etching rate of the second layer is reduced to a low rate. Although the thickness of the second layer is not particularly limited, in view of the composition of an ordinary device, it is practical that the thickness is from approximately 0.005 to 0.5 μm. Although the etching rate [R2] of the second layer is not particularly limited, in view of production efficiency, the etching rate from 0.001 to 10 Å/min is preferable.

With respect to the selective etching of the first layer, the etching rate ratio ([R1]/[R2]) is not particularly limited. When mentioned based on the premise of the device for which a high selectivity is required, it is preferably 50 or more, more preferably 10 to 5,000, furthermore preferably 30 to 3,000, particularly preferably 50~2,500.

Figure 3:
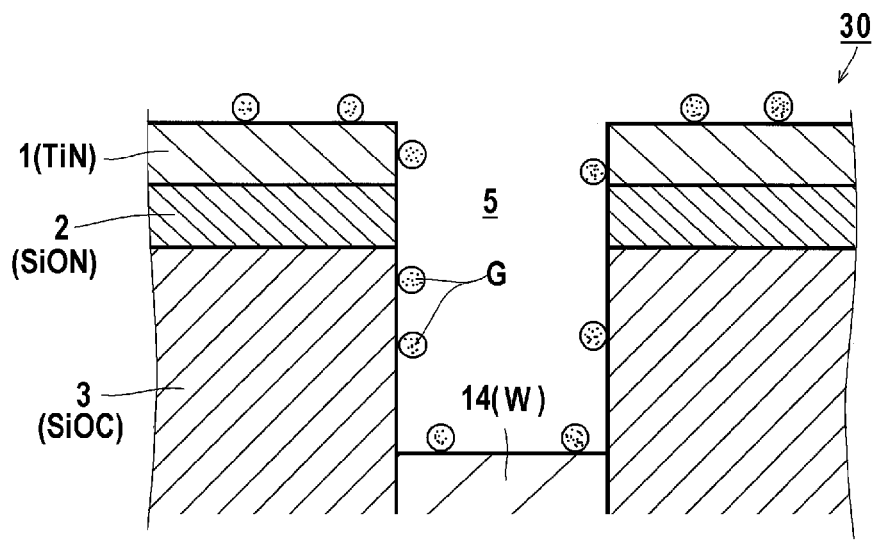
FIG. 3 is a cross-sectional view diagrammatically showing another example of production step (before etching) of the semiconductor substrate according to an embodiment of the present invention.
Figure 4:
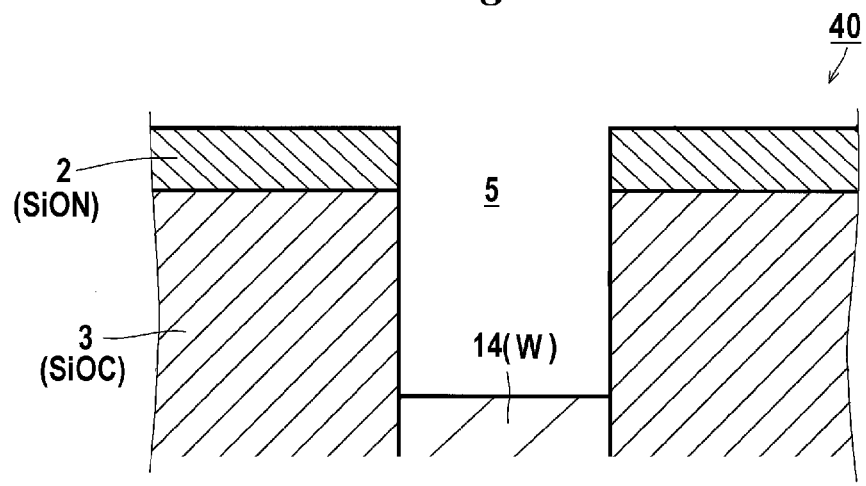
FIG. 4 is a cross-sectional view diagrammatically showing an example of production step (after etching) of the semiconductor substrate according to another embodiment of the present invention.

In the present embodiment, it is preferable that an additional step of etching a third layer containing W with an etching liquid containing a nitric acid is incorporated. That is, a substrate having a third layer containing W is provided as the above-described substrate 30, and then the etching liquid containing the nitric acid is applied to the substrate in the state that W of the third layer has been exposed (see FIG. 3). This step may be referred to as a step A. In the step A of the present embodiment, the first layer containing Ti is selectively etched without eroding W, thereby to form a processed substrate 40 (see FIG. 4). The subsequent step B is a step of conducting a processing with the specific etching liquid containing an oxidizing agent and a basic compound each of which has been previously described in detail. In this step, of the above-described second layer, a substrate having copper exposed on a surface thereof is targeted (see FIG. 1). In the present embodiment, the first layer is selectively etched by applying thereto the specific etching liquid (see FIG. 2).

It is indifferent which of the step A and the step B will be conducted first. If needed on a case-by-case basis, the step A and the step B may be repeatedly conducted whereby a semiconductor substrate having a desirable form can be formed.

[Preparation of Semiconductor Substrate Product]

In the present embodiment, it is preferable to produce a semiconductor substrate product having a desirable structure through the step of providing a semiconductor substrate having a silicon wafer on which the first layer and the second layer have been formed, and the step (B) of selectively dissolving the first layer by applying an etching liquid onto the semiconductor substrate. At this time, the specific etching liquid as described above is used as the etching liquid. Prior to the above-described etching step, it is preferable to conduct a dry etching or a dry ashing with respect to the semiconductor substrate, and then to remove a residue produced during these steps. This process is already described in this specification. Further, etching may be conducted with an etching liquid containing a nitric acid, while protecting W (step A). As each steps in the production of a semiconductor substrate product, any one of processing methods usually used for this type of the product may be used.

Of the above described production methods, it is particularly preferable in the present invention to conduct a processing under a condition from 30 to 70° C. with a liquid containing from 0.1 to 3% of TMAH, TEAH or TPAH as a basic compound, from 2 to 10% of hydrogen peroxide as an oxidizing agent and from 10 to 50% of propylene glycol or dipropylene glycol as a water-soluble organic solvent. The processing time from approximately 1 to 10 minute(s) is particularly preferable in order to balance stability of the processing and throughput. Further, a combination of a method of processing a Cu-containing substrate under the above-described conditions and a method of processing a W-containing substrate with a nitric acid having a concentration of 50% or more at a temperature from 30 to 70° C. is especially preferable as the condition for the production of a semiconductor substrate product.

The etching method and the etching liquid of the present invention enables a selective wet etching that dissolves preferentially a Ti-containing layer, and also makes it possible to wash and remove effectively a residue produced by etching, ashing and the like.

According to the method of producing a semiconductor substrate product of the present invention, the excellent etching selectivity as described above is used whereby the semiconductor substrate product having the specific structure based on the excellent etching selectivity can be produced. Further, due to an excellent removability of the residue, the step of removing the residue can be omitted. As a result, very effective production of the semiconductor substrate product can be achieved.

Further, according to the necessity, by combining a step of processing with the etching liquid which has a protection property for Cu and a step of processing with a nitric acid-containing etching liquid which has a protection property for the W-containing layer, a processing of the semiconductor substrate having a circuit wiring in which both Cu and W are incorporated and an efficient production of the device thereof can be performed.

The present invention will be described in more detail based on examples given below, but the invention is not meant to be limited by these.

EXAMPLES

Example 1 and Comparative Example 1

Etching liquids containing components shown in Table 1 below in the composition (% by mass) shown in Table 1 were prepared.

<Etching Test>

Testing wafer: A semiconductor substrate (specimen) constituted of a silicon wafer on which a TiN layer, a SiOC layer and a Cu layer were disposed in the state of alliance for test and evaluation were prepared. The semiconductor substrate was subjected to etching under the following conditions using a single wafer-type apparatus (POLOS (trade name), manufactured by SPS-Europe B.V.), and the evaluation test was conducted.

Temperature of chemical liquid: 80° C.

Discharge rate: 1 L/min.

Wafer rotation number: 500 rpm

[Washing Wiring Performance]

A surface of the etched wafer was observed using SEM to evaluate removal performance of the residue (plasma etching residue and ashing residue).

AA: Residues were completely removed.

A: Residues were approximately completely removed.

B: Residue remained undissolved as a faulty dissolved material.

C: Almost no residue was removed.

[Measurement of pH]

pHs in the following Tables were values obtained by measuring using F-51 (trade name, manufactured by HORIBA, Ltd) at room temperature (25° C.).

TABLE 1

| Sample No. | Basic compound (Content) | Organic solvent (Content) | Oxidzing agent (Content) | Evaluation temperature ° C. | pH | Washing wiring performance | TiN [R1$_{TiN}$] (Å/min) | Cu [R2$_{Cu}$] (Å/min) | [R1$_{TiN}$]/ [R2$_{Cu}$] | SiOC [R2$_{SiOC}$] (Å/min) | [R1$_{TiN}$]/ [R2$_{SiOC}$] |
|---|---|---|---|---|---|---|---|---|---|---|---|
| 101 | TMAH (1.0%) | | H$_2$O$_2$ (5%) | 60 | 12.0 | A | 156 | 3 | 52 | 1.5 | 104 |
| 102 | TEAH (1.0%) | | H$_2$O$_2$ (5%) | 60 | 11.9 | A | 148 | 3.2 | 46 | 1.9 | 78 |
| 103 | TPAH (1.0%) | | H$_2$O$_2$ (5%) | 60 | 12.0 | A | 140 | 3.5 | 40 | 2.4 | 58 |
| 104 | TBAH (1.0%) | | H$_2$O$_2$ (5%) | 60 | 12.3 | A | 138 | 3.5 | 39 | 3.1 | 45 |
| 105 | Coline hydroxide (1.0%) | | H$_2$O$_2$ (5%) | 60 | 11.7 | A | 146 | 4 | 37 | 2.1 | 70 |
| 106 | Benzyltrimethyl ammonium hydroxide (1.0%) | | H$_2$O$_2$ (5%) | 60 | 11.5 | B | 125 | 4 | 31 | 2.6 | 48 |
| 107 | Hexadecyl trimethylammmonium hydroxide (1.0%) | | H$_2$O$_2$ (5%) | 60 | 11.4 | B | 127 | 5 | 25 | 3.5 | 36 |
| 108 | Methylamine (1.0%) | | H$_2$O$_2$ (5%) | 60 | 11.3 | A | 182 | 4.8 | 38 | 1.6 | 114 |
| 109 | Etylamine (1.0%) | | H$_2$O$_2$ (5%) | 60 | 11.2 | A | 170 | 5 | 34 | 2 | 85 |
| 110 | Hexylamine (1.0%) | | H$_2$O$_2$ (5%) | 60 | 11.1 | B | 165 | 5.2 | 32 | 4.3 | 38 |
| 111 | Benzylamine (1.0%) | | H$_2$O$_2$ (5%) | 60 | 10.5 | B | 120 | 10.3 | 12 | 0.7 | 171 |
| 112 | Diethylamine (1.0%) | | H$_2$O$_2$ (5%) | 60 | 11.3 | A | 165 | 4.4 | 38 | 2 | 83 |
| 113 | Dipropylamine (1.0%) | | H$_2$O$_2$ (5%) | 60 | 11.1 | A | 170 | 4.6 | 37 | 2.6 | 65 |
| 114 | Triethylamine (1.0%) | | H$_2$O$_2$ (5%) | 60 | 11.0 | A | 150 | 3.8 | 39 | 2.5 | 60 |
| 115 | Guanidine (1.0%) | | H$_2$O$_2$ (5%) | 60 | 11.3 | B | 145 | 15.5 | 9 | 3.5 | 41 |
| 116 | 2-aminoethanol (1.0%) | | H$_2$O$_2$ (5%) | 60 | 10.5 | B | 160 | 251 | 1 | 0.65 | 246 |
| 117 | TMAH (1.0%) | Propylenglycol (10%) | H$_2$O$_2$ (5%) | 60 | 12.3 | AA | 158 | 1.7 | 93 | 0.6 | 263 |
| 118 | TMAH (1.0%) | Ethylenglycol (10%) | H$_2$O$_2$ (5%) | 60 | 12.3 | AA | 160 | 2.5 | 64 | 0.7 | 229 |
| 119 | TMAH (1.0%) | Dipropylenglycol (10%) | H$_2$O$_2$ (5%) | 60 | 12.5 | AA | 185 | 0.8 | 231 | 0.4 | 463 |
| 120 | TMAH (1.0%) | Tripropylenglycol (10%) | H$_2$O$_2$ (5%) | 60 | 10.3 | AA | 175 | 1.1 | 159 | 0.5 | 350 |
| 121 | Coline hydroxide (1.0%) | Dipropylenglycol (10%) | H$_2$O$_2$ (5%) | 60 | 12.1 | AA | 145 | 1.1 | 132 | 0.6 | 242 |
| 122 | TMAH (0.1%) | Dipropylenglycol (10%) | H$_2$O$_2$ (5%) | 60 | 8.0 | A | 80 | 2 | 40 | 0.4 | 200 |
| 123 | TMAH (5.0%) | Dipropylenglycol (10%) | H$_2$O$_2$ (5%) | 60 | 13.5 | AA | 191 | 0.8 | 239 | 1.5 | 127 |

TABLE 1-continued

| Sample No. | Basic compound (Content) | Organic solvent (Content) | Oxidzing agent (Content) | Evaluation temperature °C. | pH | Washing wiring performance | TiN [R1$_{TiN}$] (Å/min) | Cu [R2$_{Cu}$] (Å/min) | [R1$_{TiN}$]/ [R2$_{Cu}$] | SiOC [R2$_{SiOC}$] (Å/min) | [R1$_{TiN}$]/ [R2$_{SiOC}$] |
|---|---|---|---|---|---|---|---|---|---|---|---|
| 124 | TMAH (10.0%) | Dipropylenglycol (10%) | H$_2$O$_2$ (5%) | 60 | 14.0 | A | 201 | 0.7 | 287 | 2.5 | 80 |
| 125 | TMAH (15.0%) | Diethylenglycol (10%) | H$_2$O$_2$ (5%) | 60 | 14.5 | A | 222 | 0.6 | 370 | 5 | 44 |
| 126 | TEAH (0.1%) | Dipropylenglycol (10%) | H$_2$O$_2$ (5%) | 60 | 7.9 | A | 79 | 2.5 | 32 | 0.5 | 158 |
| 127 | TEAH (10.0%) | Dipropylenglycol (10%) | H$_2$O$_2$ (5%) | 60 | 13.8 | A | 195 | 1 | 195 | 6.0 | 33 |
| 128 | TMAH (1.0%) | Dipropylenglycol (5%) | H$_2$O$_2$ (5%) | 60 | 12.1 | A | 180 | 1.1 | 164 | 0.6 | 300 |
| 129 | TMAH (1.0%) | Dipropylenglycol (20%) | H$_2$O$_2$ (5%) | 60 | 12.5 | AA | 200 | 0.5 | 400 | 0.2 | 1,000 |
| 130 | TMAH (1.0%) | Dipropylenglycol (30%) | H$_2$O$_2$ (5%) | 60 | 12.7 | AA | 215 | 0.3 | 717 | 0.1 | 2,150 |
| 131 | TMAH (1.0%) | Dipropylenglycol (50%) | H$_2$O$_2$ (5%) | 60 | 13.0 | AA | 268 | 0.2 | 1,340 | 0.02 | 13,400 |
| 132 | TEAH (1.0%) | Dipropylenglycol (50%) | H$_2$O$_2$ (5%) | 60 | 13.0 | AA | 258 | 0.2 | 1,290 | 0.05 | 5,160 |
| 133 | TPAH (1.0%) | Dipropylenglycol (50%) | H$_2$O$_2$ (5%) | 60 | 13.0 | AA | 254 | 0.2 | 1,270 | 0.09 | 2,822 |
| 134 | TMAH (1.0%) | Dipropylenglycol (10%) | H$_2$O$_2$ (1%) | 60 | 12.3 | A | 113 | 0.9 | 126 | 0.3 | 377 |
| 135 | TMAH (1.0%) | Dipropylenglycol (10%) | H$_2$O$_2$ (10%) | 60 | 11.5 | AA | 287 | 0.6 | 478 | 0.4 | 718 |
| 136 | TPAH (1.0%) | Dipropylenglycol (10%) | H$_2$O$_2$ (10%) | 60 | 11.5 | AA | 254 | 0.4 | 635 | 0.8 | 318 |
| 137 | TMAH (1.0%) | Dipropylenglycol (10%) | Perboric acid (1%) | 60 | 10.3 | A | 65 | 2.2 | 30 | 1.5 | 43 |
| 138 | TMAH (1.0%) | Dipropylenglycol (10%) | Peracetic acid (0.5%) | 60 | 9.0 | A | 105 | 1.5 | 70 | 1.2 | 88 |
| 139 | TMAH (1.0%) Dipropylamine (1.0%) | Dipropylenglycol (10%) | H$_2$O$_2$ (5%) | 60 | 12.9 | AA | 165 | 1.2 | 138 | 0.5 | 330 |
| 140 | TMAH (1.0%) | Dipropylenglycol (10%) Propylenglycol (10%) | H$_2$O$_2$ (5%) | 60 | 12.8 | AA | 175 | 1 | 175 | 0.3 | 583 |
| c11 | NH$_3$ (20%) | — | H$_2$O$_2$ (5%) | 60 | 9.5 | B | 200 | 531 | 0.4 | 35 | 5.7 |
| c12 | — | — | H$_2$O$_2$ (5%) | 60 | 3.5 | C | 10 | 651 | 0 | 5 | 2 |
| c13 | TMAH (1.0%) | — | — | 60 | 12.0 | C | 2 | 15 | 0 | 10 | 0 |

As shown in the above Table 1, in the comparative examples, the selective etching of TiN and the washing performance could not be balanced. In contrast, the silicon etching liquids of the present invention (samples 101 to 140) exhibited a high etching rate with respect to TiN and, at the same time, exhibited a high etching selectivity such that both SiOC and Cu were not damaged. In addition, it is seen that the silicon etching liquids of the present invention have excellent performance to remove a dry etching residue, and also are able to improve remarkably a manufacturing quality of a semiconductor substrate having a specific structure as well as production efficiency (productivity) thereof.

Especially referring to the influence of pH, it is seen that when the pH is set at 9.5 or more, the etching selectivity for copper (Cu) becomes conspicuous as excerpted in the following Table 1A.

TABLE 1A

| No. | Basic compound | Organic solvent | Oxidzing agent | pH | Washing performance | R1/R2$_{Cu}$ |
|---|---|---|---|---|---|---|
| 122 | TMAH (0.1%) | DPG (10%) | H$_2$O$_2$ (5%) | 8.0 | A | 40 |
| 123 | TMAH (5.0%) | DPG (10%) | H$_2$O$_2$ (5%) | 13.5 | AA | 239 |
| 124 | TMAH (10.0%) | DPG (10%) | H$_2$O$_2$ (5%) | 14.0 | A | 287 |
| 125 | TMAH (15.0%) | DPG (10%) | H$_2$O$_2$ (5%) | 14.5 | A | 370 |

DPG: Dipropylenglycol

Further, effectiveness of a water-soluble organic solvent is evaluated. As excerpted in the following Table 1B, it is seen that etching selectivity for both copper and SiOC becomes conspicuous when the water-soluble organic solvent is used.

TABLE 1B

| No. | Basic compound | Organic solvent | Oxidzing agent | pH | Washing performance | $R1/R2_{Cu}$ | $R1/R2_{SiOC}$ |
|---|---|---|---|---|---|---|---|
| 101 | TMAH (1.0%) | | $H_2O_2$ (5%) | 12.0 | A | 52 | 104 |
| 117 | TMAH (1.0%) | PG (10%) | $H_2O_2$ (5%) | 12.3 | AA | 93 | 263 |
| 118 | TMAH (1.0%) | EG (10%) | $H_2O_2$ (5%) | 12.3 | AA | 64 | 229 |
| 119 | TMAH (1.0%) | DPG (10%) | $H_2O_2$ (5%) | 12.5 | AA | 231 | 463 |

PG: Propylenglycol
EG: Ethylenglycol
DPG: Dipropylenglycol

Example 2

A substrate having disposed thereon a metal layer and a silicon compound layer shown in Table 2, in addition to TiN, SiOC and Cu was prepared, and etching (Test No. 201) was conducted in the same manner as the Test No. 124. The results are shown in the upper column of Table 2. In addition, the results of etching selection ratio were shown in the lower column of Table 2 together with the results of the above-described TiN, SiOC, Cu and SiOx.

TABLE 2

| Test 201 | Cu | SiOC | SiN | SiON | SiOx |
|---|---|---|---|---|---|
| Ratio to TiN $[R1_{TiN}]/[R2_{XX}]$ | 400 | 1,000 | 20,000 | 400 | 100 |
| Ratio to Ti $[R1_{Ti}]/[R2_{XX}]$ | 222 | 555 | 11,100 | 222 | 56 |

Example 2A

The above-described testing liquid No. 124 for evaluation was subjected to evaluation by changing a temperature. The selection ratios were shown collectively in the lower column of Table 2A.

TABLE 2A

| Test No. | Basic compound (Content) | Organic solvent (Content) | Oxidzing agent (Content) | Evaluation temperature ° C. | pH | Washing wiring performance | TiN $[R1_{TiN}]$ (Å/min) | Cu $[R2_{Cu}]$ (Å/min) | [R1TiN/ $[R2_{Cu}]$ | SiOC $[R2_{SiOC}]$ (Å/min) | [R1TiN]/ $[R2_{SiOC}]$ |
|---|---|---|---|---|---|---|---|---|---|---|---|
| 201A | TMAH (1.0%) | Dipropylenglycol (20%) | $H_2O_2$ (5%) | 30 | 12.5 | A | 45 | 0.3 | 150 | 0.1 | 450 |
| 201B | TMAH (1.0%) | Dipropylenglycol (20%) | $H_2O_2$ (5%) | 40 | 12.5 | A | 89 | 0.4 | 223 | 0.15 | 593 |
| 201C | TMAH (1.0%) | Dipropylenglycol (20%) | $H_2O_2$ (5%) | 50 | 12.5 | AA | 126 | 0.5 | 252 | 0.13 | 969 |
| 201D | TMAH (1.0%) | Dipropylenglycol (20%) | $H_2O_2$ (5%) | 60 | 12.5 | AA | 200 | 0.5 | 400 | 0.2 | 1,000 |
| 201E | TMAH (1.0%) | Dipropylenglycol (20%) | $H_2O_2$ (5%) | 70 | 12.5 | AA | 352 | 1.2 | 293 | 0.7 | 503 |

As shown in the above table, it is seen that good etching ratio and selectivity of the etching were also obtained in the prescribed combinations other than TiN/SiOC and TiN/Cu according to the present invention. It was confirmed that not very high selectivity was obtained with respect to SiOx.

Example 3

As shown below, etching tests relating to a combination of a step of using a nitric acid etching liquid with a specific etching liquid containing both the hydrogen peroxide and the basic compound described above were conducted.

First, a 69 mass % concentrated nitric acid was prepared. Etching with the above-described concentrated nitric acid was conducted in the same manner as the example 1, except that a wafer having a layer of W in place of Cu was used. Etching rate of each of W, SiON and SiOC was almost 0 Å/min. On the other hand, it was confirmed that TiN was selectively etched at the rate of 100 Å/min. Etching performance of the Cu layer was also evaluated similarly using a concentrated nitric acid. As a result, it was confirmed that the Cu layer exhibited such extremely high etching rate as a range of approximately 1,000 to 5,000 Å/min.

Further, the three layer structure constituted of a first layer (Cu), a second layer and a third layer (Cu) was prepared using the chemical liquid (124) used in the example 1 and a nitric acid, and then electric characterization of the processed wafer was conducted. As a result, in the electric characterization between wirings, any problem such as increase of resistance value, insulation, or the like was not confirmed. From this evaluation result, it is seen that a device having a W electrode together with a Cu electrode can be favorably produced by using a kit constituted of a nitric acid etching liquid and the specific etching liquid as described above in combination.

TABLE 3

| Test No. | Nitric acid (Concentration) | Evaluation temperature ° C. | Washing wiring performance | TiN [R1$_{TiN}$] (Å/min) | W [R2$_W$] (Å/min) | [R1$_{TiN}$]/ [R2$_W$] | SiOC [R2$_{SiOC}$] (Å/min) | [R1$_{TiN}$]/ [R2$_{SiOC}$] |
|---|---|---|---|---|---|---|---|---|
| 301 | 69% HNO$_3$ | 60 | AA | 105 | 0.1 | 1050 | 0.01 | 10500 |
| 302 | 69% HNO$_3$ | 70 | AA | 125 | 0.1 | 1250 | 0.02 | 6250 |
| 303 | 79% HNO$_3$ | 60 | AA | 116 | 0.1 | 1160 | 0.01 | 11600 |

Having described our invention as related to the present embodiments, it is our intention that the invention not be limited by any of the details of the description, unless otherwise specified, but rather be construed broadly within its spirit and scope as set out in the accompanying claims.

The invention claimed is:

1. An etching liquid for selective etching of a first layer containing Ti with regard to a second layer containing Cu, the etching liquid comprising, in an aqueous medium, a basic compound composed of an organic amine compound, a water soluble organic solvent and an oxidizing agent, the etching liquid having a pH of 9 or more,
   wherein the basic compound composed of an organic amine compound is selected from the group consisting of tetramthylammonium hydroxide, tetraethylammonium hydroxide and tetrapropylammonium hydroxide,
   the water soluble organic solvent is selected from the group consisting of propylenglycol, ethylenglycol and dipropylenglycol,
   the oxidizing agent is selcted from the group consisting of hydrogen peroxide and peracetic acid, and
   the basic compound is present in an amount of 1 to 10% by mass, the organic solvent is present in an amount of 5 to 50% by mass, and the oxidizing agent is present in an amount of 0.5 to 10% by mass, with respect to the total amount of the etching liquid.

2. The etching liquid for slective etching of a first layer containing Ti with regard to a second layer containing Cu according to claim 1, wherein the etching liquid has an etching rate (R1) for the first layer and an etching rate (R2) for thw second layer, and a rate ratio (R1/R2) is 30 or more.

3. A method of etching a semiconductor substrate, comprising the steps of:
   providing a semiconductor substrate having a first layer and a second layer, the first layer containing Ti, and the second layer containing Cu;
   providing an etching liquid according to claim 1; and
   applying the etching liquid to the semiconductor substrate to selectively etch the first layer of the semiconductor substrate relative to the second layer.

4. The etching method according to claim 3, wherein a rate ratio (R1/R2) of an etching rate (R1) of the first layer to an etching rate (R2) of the second layer is set at 30 or more.

5. The etching method according to claim 3, wherein the etching Liquid further comprises a water-soluble organic solvent.

6. The etching method according to claim 3, wherein the etching liquid is applied to selectively etch the first layer in the state that copper of the second layer is exposed, and wherein the semiconductor substrate has a third layer containing W, and the first layer is selectively etched by applying an etching liquid containing nitric acid in the state that W is exposed.

7. The etching method according to claim 3, wherein the etching is conduct at within a temperature range from 20 to 80° C.

8. A kit, comprising:
   a first etching liquid according to claim 1 for selective etching of the first layer in the state that copper of the second layer is exposed; and
   a second etching liquid containing nitric acid for selective etching of the first layer when a third layer containing W is exposed, W being contained in a semiconductor substrate.

9. A method for producing a semiconductor substrate product, comprising the steps of:
   providing a semiconductor substrate having a first layer and a second layer, the first layer containing Ti, and the second layer containing Cu;
   providing a first etching liquid according to claim 1; and
   applying the first etching liquid to the semiconductor substrate to selectively etch the first layer of the semiconductor substrate relative to the second layer.

10. The method of producing a semiconductor substrate product according to claim 9, comprising the steps of:
    providing the semiconductor substrate having the first layer, the second layer, and a third layer containing W;
    applying a second etching liquid containing nitric acid to selectively etch the first layer, in the state that the third layer is exposed; and
    applying the first etching liquid to selectively etch the first layer, in the state that copper of the second layer is exposed.

11. The etching liquid for selective etching of a first layer containing Ti with regard to a second layer containing Cu according to claim 6, wherein the pH of the etching liquid is from 10 to 13.

12. The etching liquid for selective etching of a first layer containing Ti with regard to a second layer containing Cu according to claim 1, wherein the etching liquid consists essentially of, in an aqueous medium, the basic compound composed of an organic amine compound, the water soluble organic solvent and the oxidizing agent.

* * * * *